(12) United States Patent
Kuang et al.

(10) Patent No.: US 10,090,196 B2
(45) Date of Patent: Oct. 2, 2018

(54) 3D INTEGRATED CIRCUIT AND METHODS OF FORMING THE SAME

(71) Applicant: Taiwan Semiconductor Manufacturing Company, Ltd., Hsin-Chu (TW)

(72) Inventors: Hsun-Chung Kuang, Hsin-Chu (TW); Yen-Chang Chu, Tainan (TW); Cheng-Tai Hsiao, Tainan (TW); Ping-Yin Liu, Yonghe (TW); Lan-Lin Chao, Sindian (TW); Yeur-Luen Tu, Taichung (TW); Chia-Shiung Tsai, Hsin-Chu (TW); Xiaomeng Chen, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/018,422

(22) Filed: Feb. 8, 2016

(65) Prior Publication Data
US 2016/0155665 A1    Jun. 2, 2016

Related U.S. Application Data

(62) Division of application No. 14/056,345, filed on Oct. 17, 2013, now Pat. No. 9,257,399.

(51) Int. Cl.
*H01L 25/065* (2006.01)
*H01L 25/04* (2014.01)
(Continued)

(52) U.S. Cl.
CPC .. *H01L 21/76883* (2013.01); *H01L 21/76805* (2013.01); *H01L 23/291* (2013.01); *H01L 23/293* (2013.01); *H01L 23/3192* (2013.01); *H01L 23/538* (2013.01); *H01L 23/5385* (2013.01); *H01L 24/06* (2013.01); *H01L 24/10* (2013.01); *H01L 24/18* (2013.01); *H01L 24/80* (2013.01); *H01L 24/89* (2013.01); *H01L 25/043* (2013.01); *H01L 25/0657* (2013.01);
(Continued)

(58) Field of Classification Search
CPC .............. H01L 25/0657; H01L 25/043; H01L 25/0756; H01L 24/06; H01L 24/10; H01L 24/18; H01L 23/538; H01L 23/5385
See application file for complete search history.

(56) References Cited

U.S. PATENT DOCUMENTS 5,419,806 A    5/1995   Huebner
2003/0203614 A1   10/2003   Rajagopalan et al.
(Continued)

*Primary Examiner* — Phat X Cao
(74) *Attorney, Agent, or Firm* — Slater Matsil, LLP

(57) ABSTRACT

An integrated circuit structure includes a package component, which further includes a non-porous dielectric layer having a first porosity, and a porous dielectric layer over and contacting the non-porous dielectric layer, wherein the porous dielectric layer has a second porosity higher than the first porosity. A bond pad penetrates through the non-porous dielectric layer and the porous dielectric layer. A dielectric barrier layer is overlying, and in contact with, the porous dielectric layer. The bond pad is exposed through the dielectric barrier layer. The dielectric barrier layer has a planar top surface. The bond pad has a planar top surface higher than a bottom surface of the dielectric barrier layer.

20 Claims, 11 Drawing Sheets

(51) Int. Cl.
   *H01L 21/768* (2006.01)
   *H01L 23/00* (2006.01)
   *H01L 23/31* (2006.01)
   *H01L 25/075* (2006.01)
   *H01L 23/538* (2006.01)
   *H01L 23/29* (2006.01)
   *H01L 25/00* (2006.01)

(52) U.S. Cl.
   CPC .......... *H01L 25/0756* (2013.01); *H01L 25/50* (2013.01); *H01L 23/562* (2013.01); *H01L 24/05* (2013.01); *H01L 24/08* (2013.01); *H01L 2224/03616* (2013.01); *H01L 2224/05547* (2013.01); *H01L 2224/05624* (2013.01); *H01L 2224/05647* (2013.01); *H01L 2224/05684* (2013.01); *H01L 2224/80097* (2013.01); *H01L 2224/80201* (2013.01); *H01L 2224/80357* (2013.01); *H01L 2224/80895* (2013.01); *H01L 2224/80896* (2013.01); *H01L 2224/80948* (2013.01); *H01L 2225/06513* (2013.01); *H01L 2924/01029* (2013.01); *H01L 2924/01322* (2013.01)

(56) References Cited

U.S. PATENT DOCUMENTS

| | | | |
|---|---|---|---|
| 2006/0058487 A1* | 3/2006 | Rantala | C08G 77/50 528/33 |
| 2007/0164279 A1 | 7/2007 | Lin et al. | |
| 2009/0224371 A1* | 9/2009 | Yu | H01L 21/76898 257/621 |
| 2013/0270328 A1 | 10/2013 | Di Cioccio et al. | |
| 2013/0285253 A1* | 10/2013 | Aoki | H01L 21/76251 257/774 |
| 2014/0183746 A1 | 7/2014 | Lin et al. | |

* cited by examiner

3D INTEGRATED CIRCUIT AND METHODS OF FORMING THE SAME

This application is a divisional of U.S. patent application Ser. No. 14/056,345, filed Oct. 17, 2013, and entitled "3D Integrated Circuit and Methods of Forming the Same," which application is incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a specific pressure and temperature. In various conditions, the eutectic materials are melted. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

The previously developed bonding methods have their disadvantages. For example, regarding the fusion bonding, extra electrical connections are needed to interconnect the bonded wafers. Accuracy of the eutectic bonding is low, and there may be metal-squeeze due to the melting of the bonding metals. Throughput of the direct metal-to-metal bonding is also low. In the hybrid bonding, the metal pads have higher Coefficients of Thermal Expansion (CTEs) than the dielectric layers at the surfaces of the bonded wafers. This results in problems in bonding the dielectric layers. For example, the bonds between the metal pads may delaminate if the expanded volume of the metal pads is smaller than the dishing volume of the metal pads. Conversely, if the expanded volume of the metal pads is significantly greater than the dishing volume, the bonds between the dielectric layers may delaminate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of various embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package including hybrid bonding and methods of forming the same are provided in accordance with various exemplary embodiments. Intermediate stages of forming the package are illustrated. Variations of the embodiments are discussed. Throughout the various views and illustrative embodiments, like reference numbers are used to designate like elements.

Figure 1:
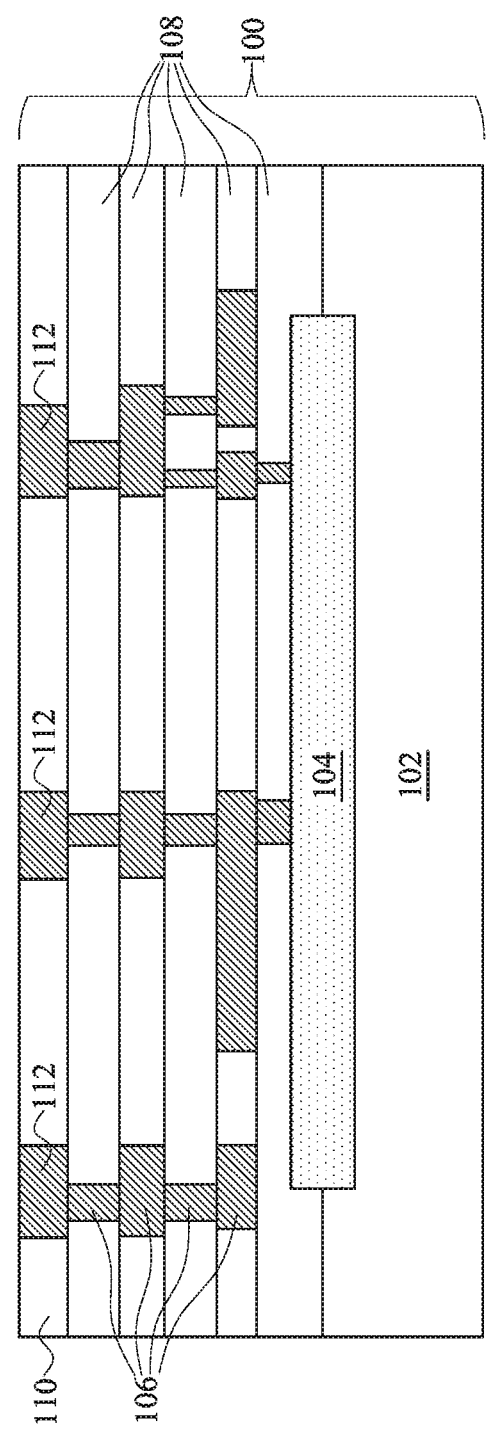
FIGS. 1 through 5 are cross-sectional views of intermediate stages in the formation of a first package component in accordance with some exemplary embodiments.

FIGS. 1 through 5 illustrate cross-sectional views of intermediate stages in the formation of a package component in accordance with some embodiments. Referring to FIG. 1, package component 100 is illustrated. Package component 100 may comprise a device wafer, a packaged wafer, an interposer wafer, or the like. In the embodiments package component 100 comprises a device wafer, package component 100 includes semiconductor substrate 102, which may be, for example, a silicon substrate. Other semiconductor substrates such as silicon carbon substrates, silicon germanium substrates, and III-V compound semiconductor substrates are also usable. Active devices 104 may be formed on a surface of substrate 102, and may include, for example, transistors. Metal lines and vias 106 are formed in dielectric layers 108, which may include Inter-Layer Dielectric (ILD), Inter-Metal Dielectric (IMD) layers, passivation layers, and the like. The ILD layer and the IMD layers may be low-k dielectric layers in some embodiments, which have dielectric constants (k values) smaller than a pre-determined value, such as smaller than about 3.5, smaller than about 3.0, smaller than about 2.5, etc. Dielectric layers 108 may include non-low-k dielectric materials having dielectric constants (k values) equal to or greater than 3.8. Metal traces 106 (which include metal lines and vias) may include copper, aluminum, nickel, tungsten, or alloys thereof. Metal lines and vias 106 interconnect active devices 104, and electrically connect active devices 104 to the overlying metal features 112.

In alternative embodiments, package component 100 is an interposer wafer, which is free from active devices therein. Package component 100 may, or may not, include passive devices (not shown) such as resistors, capacitors, inductors, transformers, and the like in accordance with some embodiments.

In yet alternative embodiments, package component 100 is a package substrate. In some embodiments, package component 100 is a laminate package substrate, wherein conductive traces 106 are embedded in laminate dielectric layers 108 as schematically illustrated. In alternative embodiments, package components 100 are built-up package substrates, which comprise cores (not shown), and conductive traces (represented by traces 106) built on opposite sides of the cores. The core of a built-up package substrate includes a fiber layer (not shown) and metallic features (not shown) penetrating through the fiber layer, with the conductive traces interconnected through the metallic features. The conductive traces 106 are interconnected through conductive features in the cores.

In various embodiments wherein package component 100 is a device wafer, an interposer wafer, a package substrate, or the like, dielectric layer 110 is formed, which may be a top IMD layer. In some embodiments, dielectric layer 110 is a low-k dielectric layer having k value lower than about 3.0, lower than about 2.5, or lower than about 2.0. In alternative embodiments, dielectric layer 110 comprises silicon oxide, silicon oxynitride, silicon nitride, or the like. Metal features 112 are formed in dielectric layer 110, and may be electrically coupled to active devices 104 through metal lines and vias 106. Metal features 112 may be metal lines or metal pads. Metal features 112 may also be formed of copper, aluminum, nickel, tungsten, alloys of the above-mentioned metals, or other appropriate materials. The top surface of dielectric layer 110 and the top surfaces of metal features 112 may be substantially level with each other. In the embodiments wherein package component 100 is a device wafer, dielectric layer 110 and metal features 112 may be on the front side (the side with active devices 104) or the backside (the side underlying substrate 102) of substrate 102. For example, FIG. 1 illustrates that dielectric layer 110 and metal features 112 are on the front side of substrate 102.

Each or some of metal lines and vias 106 and metal features 112 may include a copper-containing region (not shown) and a conductive barrier layer separating the copper-containing region from the respective dielectric. The conductive barrier layer may include titanium, titanium nitride, tantalum, tantalum nitride, or the like.

Figure 2:
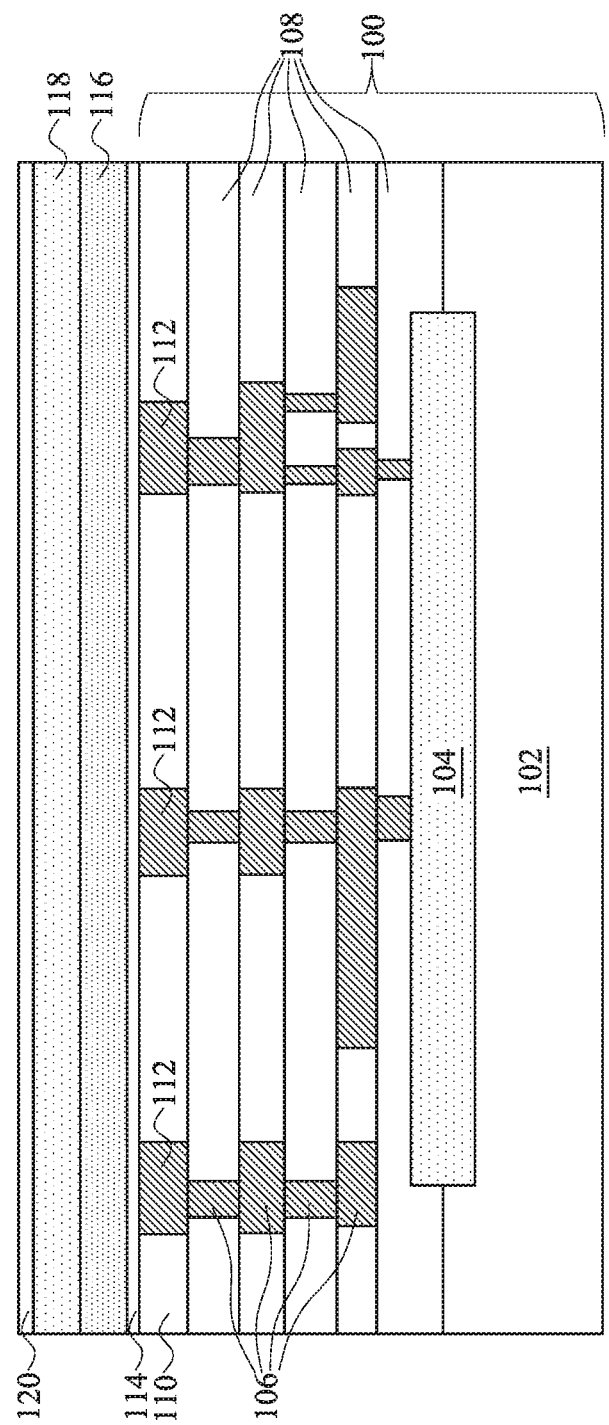
Figure 11:
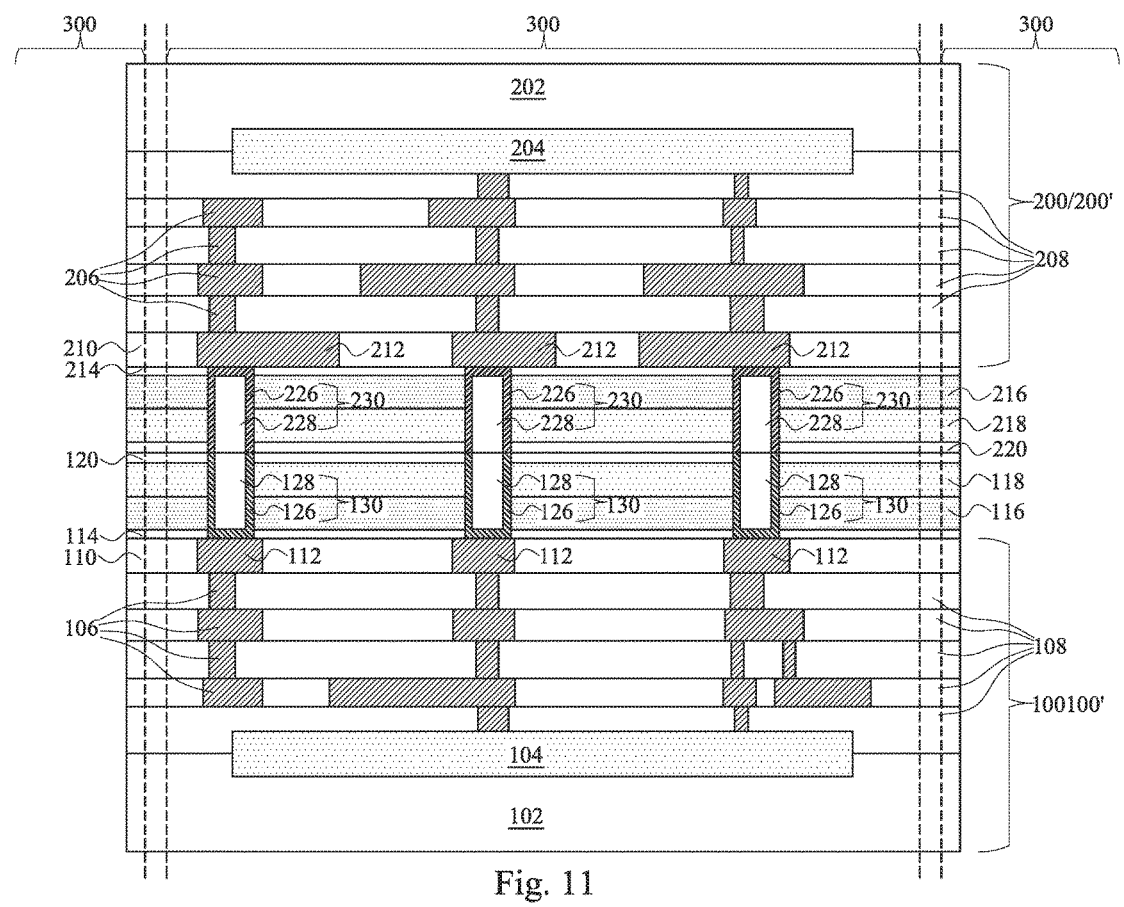
FIG. 11 illustrates the cross-sectional view of the bonding of two package components in accordance with some exemplary embodiments.

Referring to FIG. 2, a plurality of layers is formed. In some embodiments, the plurality of layers includes etch stop layer 114, non-porous dielectric layer 116 over etch stop layer 114, porous dielectric layer 118 over non-porous dielectric layer 116, and dielectric barrier layer 120 over porous dielectric layer 118. The overlying ones of the plurality of layers may be in physical contact with the respective underlying layers. In some embodiments, etch stop layer 114 comprises silicon carbide, silicon nitride, silicon oxynitride, or other dielectric materials. Non-porous dielectric layer 116 may also be a non-low-k dielectric layer having a k value equal to or higher than about 3.8. Furthermore, the porosity of non-porous dielectric layer 116 may be lower than about 5 percent. When the porosity is lower than about 5 percent, non-porous dielectric layer 116 does not have the function of releasing stress generated due to the subsequent bonding of package components 100 and 200 (FIG. 11). In some exemplary embodiments, non-porous dielectric layer 116 is formed of Un-doped Silicate Glass (USG), silicon oxide, or the like. The formation methods of non-porous dielectric layer 116 may include a Chemical Vapor Deposition (CVD) method such as High-Density Plasma CVD (HDPCVD), Plasma Enhanced Chemical Vapor Deposition (PECVD), Atomic Layer Deposition (ALD), or the like.

Porous dielectric layer 118 may also be a low-k dielectric having a k value lower than 3.8, or lower than about 3.0. The low-k dielectric materials having k values lower than 3.8 are low-k dielectric materials. The k value of dielectric layer 118 may also be between about 2.5 and 3.0. Furthermore, the porosity of porous dielectric layer 118 is higher than the porosity of non-porous dielectric layer 116. For example, the porosity of porous dielectric layer 118 may be higher than about 5 percent and about 40 percent. When the porosity of porous dielectric layer 118 reaches about 5 percent, porous dielectric layer 118 starts to cause releasing the stress generated due to the subsequent bonding of package components 100 and 200 (FIG. 11). When the porosity of porous dielectric layer 118 further increases, the stress is released better. The porosity of porous dielectric layer 118 is selected to be lower than about 40 percent since when the porosity of porous dielectric layer 118 reaches about 40 percent, porous dielectric layer 118 may breakdown. In some exemplary embodiments, porous dielectric layer 118 comprises a carbon-containing dielectric. The formation methods of non-porous dielectric layer 116 may include $SiO_2$, Phosphosilicate Glass (PSG), Fluorine-doped Silicate Glass (FSG, or the like.

Dielectric barrier layer 120 comprises a dielectric material, which may be, for example, a silicon-based dielectric such as silicon nitride, silicon oxynitride, or the like. Dielectric barrier layer 120 has the function of bonding to another die/wafer through fusion bonding, and may also block copper from diffusing through.

Figure 3:
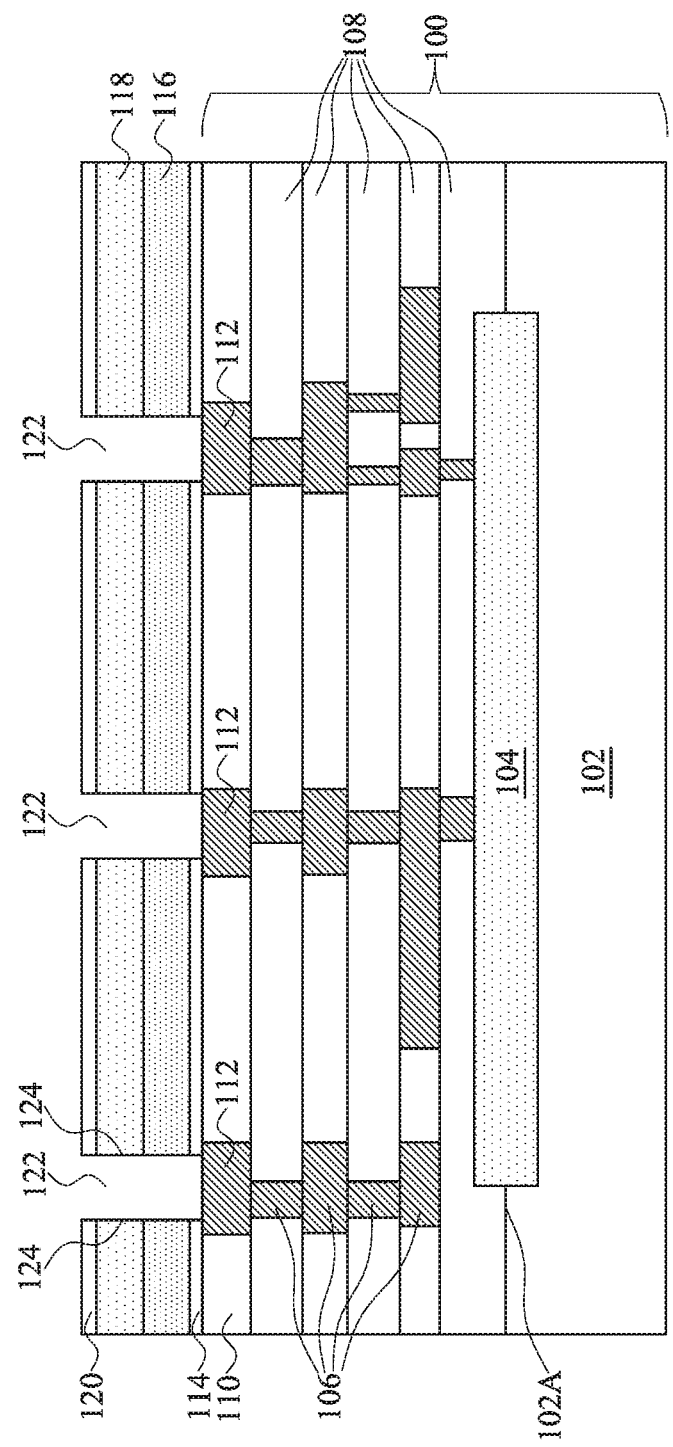

Referring to FIG. 3, an etching step is performed through a photolithography process, and hence openings 122 are formed in dielectric layers 114, 116, 118, and 120. In the etching step, etch stop layer 114 is used to stop the etching, and then etch stop layer 114 is further etched to expose the underlying metal features 112. Openings 122 thus have sidewalls 124 that continuously extend from the top surface of dielectric barrier layer 120 to the top surface of metal features 112. In accordance with some embodiments, sidewalls 124 are substantially straight sidewalls that are substantially perpendicular to top surface 102A of substrate 102, although sidewalls 124 may also be tilted.

Figure 4:
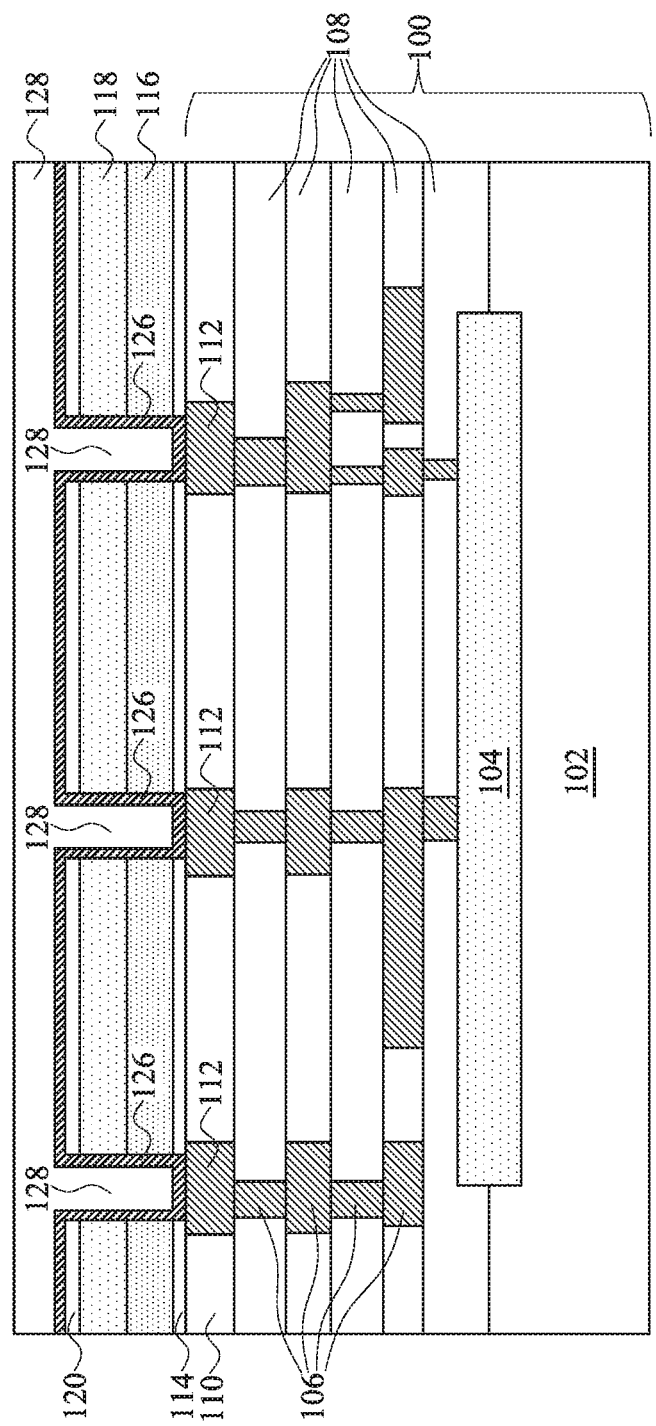

Next, conductive barrier layer 126 and metallic material 128 are filled into openings 122, resulting in a structure shown in FIG. 4. In some embodiments, conductive barrier layer 126 comprises titanium, titanium nitride, tantalum, tantalum nitride, combinations thereof, multi-layers thereof, or other materials. Metallic material 128 may be a copper-containing material including substantially pure copper or a copper alloy. Metallic material 128 may also include aluminum, nickel, or the like.

Figure 5:
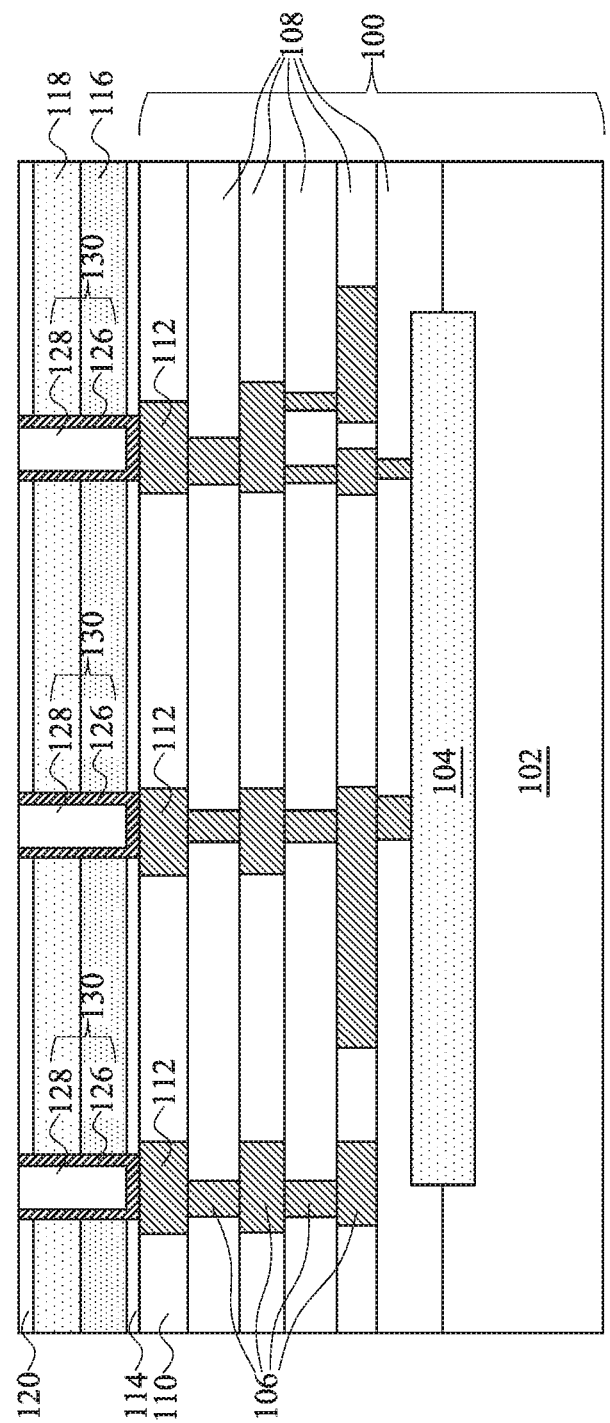

A Planarization such as a Chemical Mechanical Polish (CMP) is then performed. Dielectric barrier layer 120 may be used as a CMP stop layer. As a result, the top surface of the remaining metallic material 128 is coplanar with the top surface of dielectric barrier layer 120. The resulting structure is shown in FIG. 5. The remaining portions of conductive barrier 126 and the respective overlying metallic material 128 are in combination referred to as bond pad 130 hereinafter. The metal pads 130 may include dishing in some embodiments. As shown in FIG. 5, each of bond pads 130 has a substantially straight edge continuously extending from the top surface of the dielectric barrier layer 120 to metal feature 112.

Figure 6:
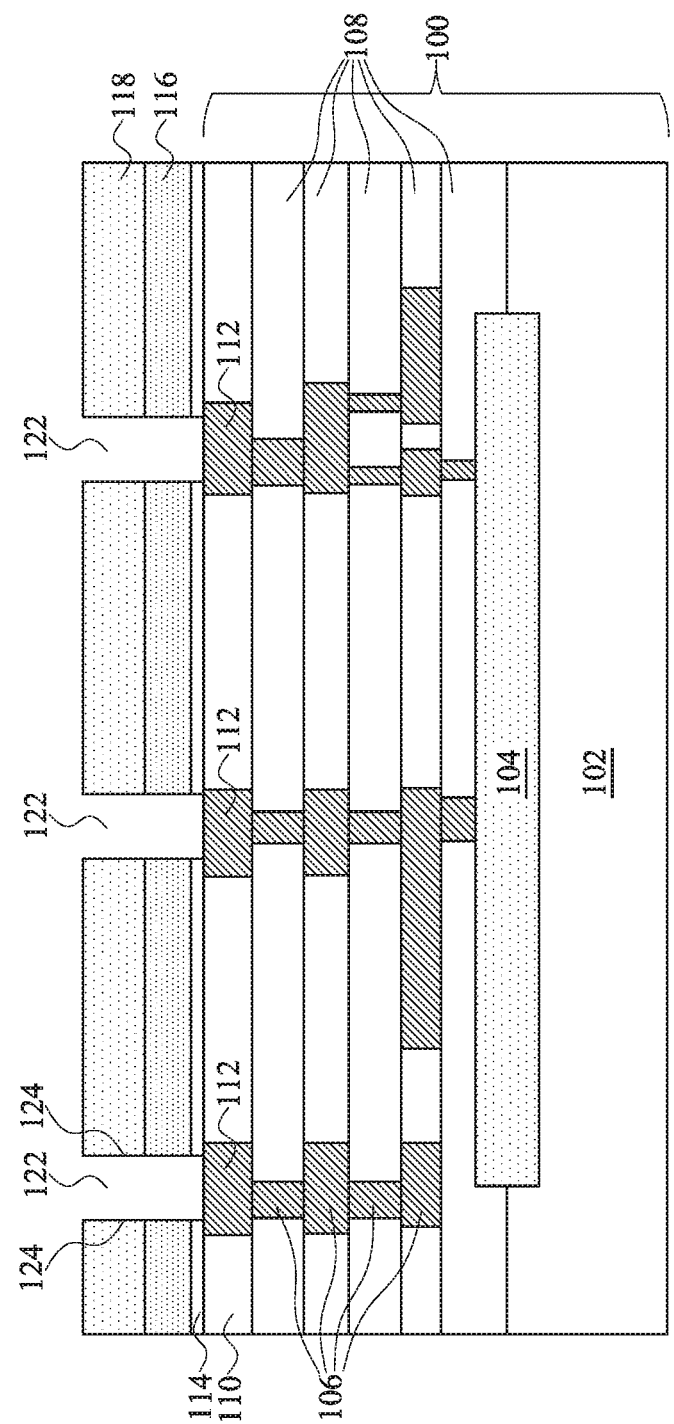
FIGS. 6 through 9 are cross-sectional views of intermediate stages in the formation of the first package component in accordance with alternative embodiments.
Figure 7:
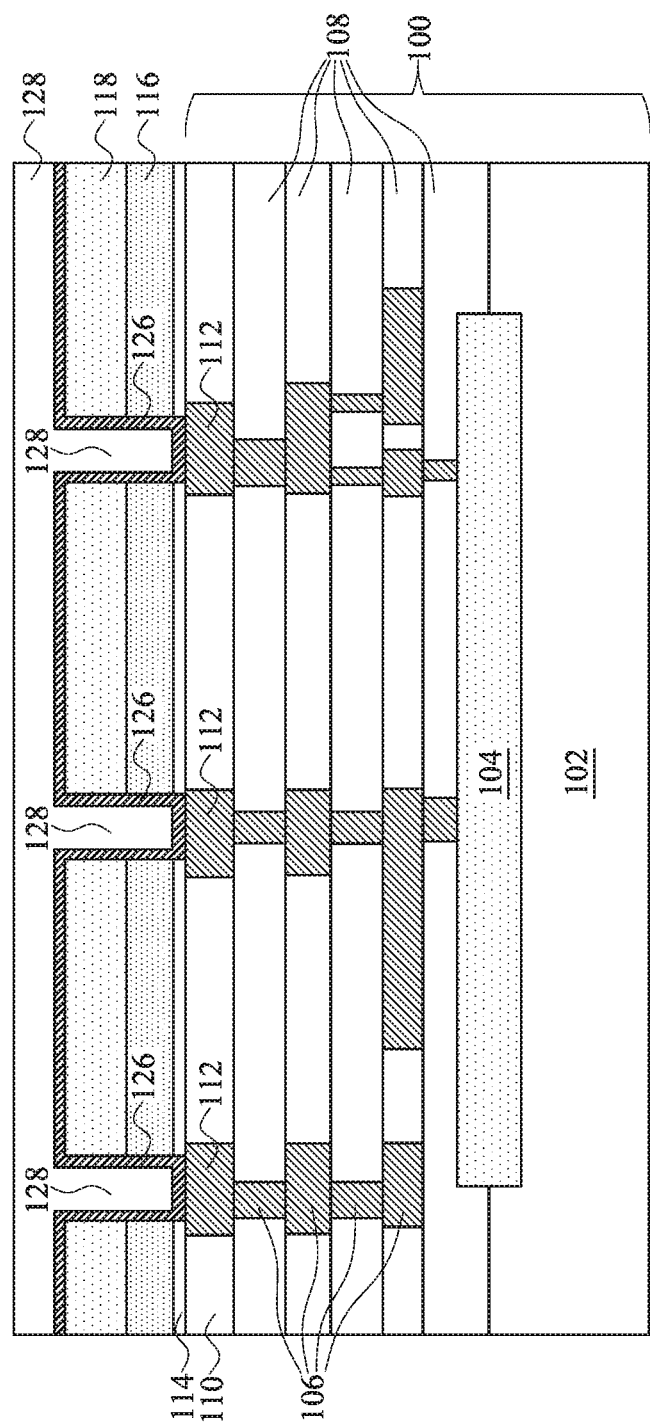
Figure 8:
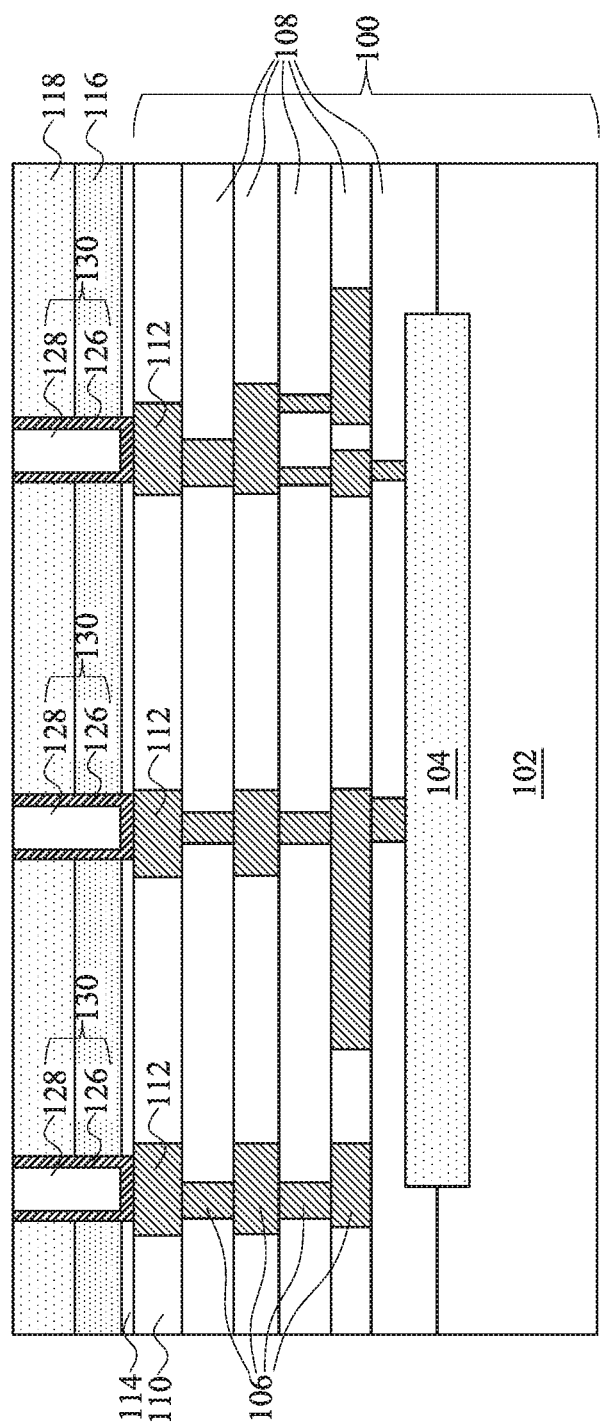
Figure 9:
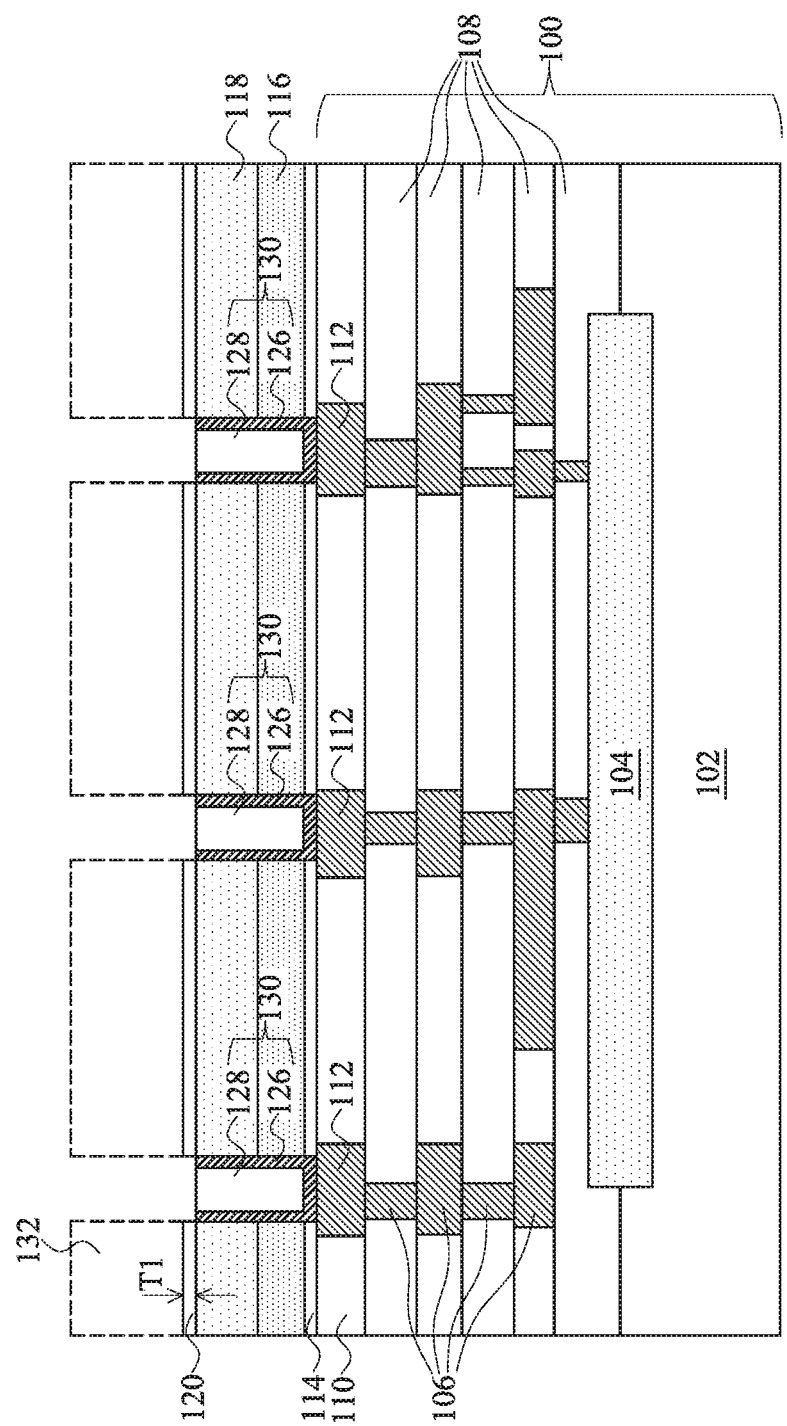

FIGS. 6 through 9 illustrate the formation of bond pads 130 and dielectric barrier layer 120 in accordance with alternative embodiments. These embodiments are similar to the embodiments in FIGS. 1 through 5, except dielectric barrier layer 120 (FIG. 9) is formed after the formation of bond pads 130, and may be formed using an organic material such as a siloxane-based polymer. Referring to FIG. 6, etch stop layer 114, non-porous dielectric layer 116, and porous dielectric material 118 are formed. Openings 122 are then formed in layers 114, 116, and 118, so that the underlying metal features 112 are exposed. Next, referring to FIG. 7, conductive barrier layer 126 and metallic material 128 are filled into openings 122. A CMP is then performed to remove excess portions of conductive barrier layer 126 and metallic material 128, forming bond pads 130, as shown in FIG. 8. The top surfaces of the resulting bond pads 130 are coplanar with the top surface of porous dielectric material 118, although dishing may sometimes occur to bond pads 130. In a subsequent step, as shown in FIG. 9, a blanket dielectric barrier layer 120 is formed over bond pads 130 and porous dielectric material 118. A photolithography process is then performed to remove the portions of blanket dielectric barrier layer 120, which removes portions covering bond pads 130. The photolithography process may be performed using photo resist 132 as an etching mask. After the patterning of dielectric barrier layer 120, photo resist 132 is removed.

In some embodiments, dielectric barrier layer 120 comprises a siloxane-based polymer. For example, the siloxane-based polymer may be the SINR™ provided by Shin-Etsu Chemical Co., LTD. Thickness T1 of dielectric barrier layer 120 may be smaller than about 1 µm, so that in the subsequent bonding process, the expanded metallic material 128 (when heated, for example) may protrude out of the top surface of dielectric barrier layer 120, and contact the metal pad in another wafer/die.

Figure 10:
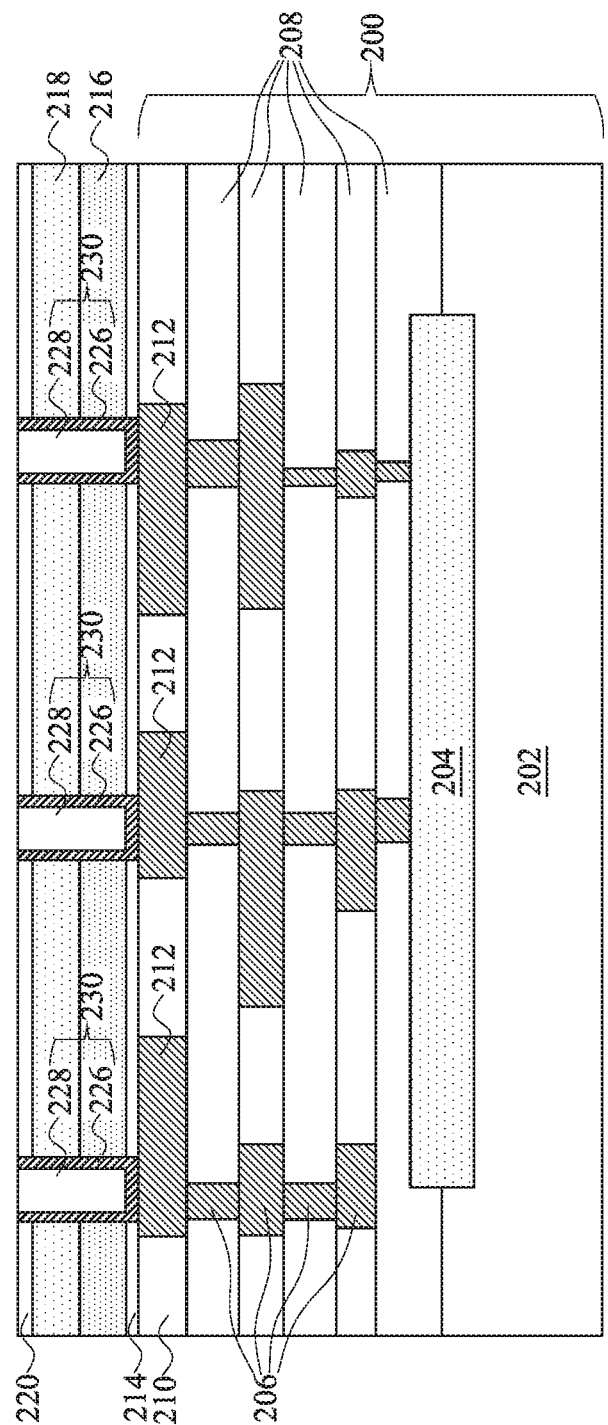
FIG. 10 illustrates a cross-sectional view of a second package component in accordance with alternative embodiments.

FIG. 10 illustrates package component 200 to be bonded to package component 100 in FIG. 5 or FIG. 9. Package component 200 may have a structure similar to what is described for package component 100 (FIGS. 5 and 9), and the details are not repeated herein. The materials of the features in package component 200 may be found referring to the like features in package component 100 as described referring to FIGS. 1 through 9. The features corresponding to the features in package component 100 have reference numerals starting with number "1." while the features corresponding to the features in package component 200 have reference numerals starting with number "2."

Package component 200 may also be selected from a device wafer, an interposer wafer, a package substrate, and the like. In the illustrated FIG. 10, package component 200 includes substrate 202, active devices 204, dielectric layers 208, metal lines and vias 206 in dielectric layers 208. In alternative embodiments, package component 200 does not include active devices such as transistors, diodes, or the like.

In some embodiments, package component 200 may also include etch stop layer 214, non-porous dielectric layer 216, porous dielectric layer 218, dielectric barrier layer 220, and bond pads 230. Bond pads 230 may further include conductive barrier layer 226 and copper-containing metallic material 228 over dielectric barrier layer 216.

In alternative embodiments, package component 200 may not include porous dielectric layer 218. Rather, conductive barrier layer 226 may be formed directly over and contacting non-porous dielectric layer 216, which may comprise USG, silicon oxide, or the like. In these embodiments, the stress applied to the bonded bond pads 130/230 (FIG. 11) and dielectric layers in the subsequent bonding process are absorbed by porous dielectric layer 118 in package component 100.

Next, as shown in FIG. 11, package components 100 and 200 are pre-bonded. In the pre-bonding, package components 100 and 200 are first aligned, with bond pads 130 of package component 100 aligned to bond pads 230 of package component 200. After the alignment, package components 100 and 200 are pressed against each other. During pre-bonding, a pressing force may be applied to press package components 100 and 200 against each other, in which the pressing force may be lower than about 5 Newton per die, for example. In the embodiments dielectric barrier layers 120 and 220 are formed of inorganic materials, the pre-bonding may be performed at the room temperature (for example, between about 21° C. to about 25° C.), although higher or lower temperatures may be used. The bonding time may be shorter than about 1 minute, for example.

In the embodiments wherein dielectric barrier layers 120 and 220 are formed of organic materials such as SINR, pre-bonding may be performed at an elevated temperature in the range between about 140° C. and about 160° C. The pre-bonding may last, for example, for a period of time in the range between about 1 minute and about 5 minutes.

Furthermore, after the pre-bonding, a curing process may be performed to drive solvents in dielectric barrier layers 120 and 220 out of the respective package components 100 and 200. In some exemplary embodiments, the curing is performed at a temperature in the range between about 170° C. and about 190° C. The curing may last, for example, for a period of time in the range between about 60 minutes and about 120 minutes. In the embodiments wherein dielectric barrier layers 120 and 220 are formed of inorganic materials, the curing step may be skipped.

After the pre-bonding, dielectric barrier layers 120 and 220 are bonded to each other. The bonding strength, however, are improved in a subsequent annealing step, in some embodiments. The bonded package components 100 and 200 may be annealed at a temperature between about 300° C. and about 400° C., for example. The annealing may be performed for a period of time between about 1 hour and 2 hours. When temperature rises, the hydroxide (OH) bonds (if any) in surface dielectric layers 110 and 210 break to form strong Si—O—Si bonds, and hence package components 100 and 200 are bonded to each other through fusion bonds (and through Van Der Waals force). In addition, during the annealing, the metal, such as copper, in bond pads 130 and 230 inter-diffuse to each other, so that metal-to-metal bonds are also formed. In various embodiments, the resulting bonds between package components 100 and 200 are called hybrid bonds, which include both the metal-to-metal bonds and Si—O—Si bonds and are different from the metal-to-metal bonds only or Si—O—Si bonds only. After the bonding, the bonded package components 100 and 200 are sawed into a plurality of packages 300. Each of the packages includes die 100' and die 200', which are the separated portions of package components 100 and 200, respectively.

In the bonding process, temperature is increased above room temperature (for example, about 21° C.), and bond pads 130 and 230 expand. The Coefficient of Thermal Expansion (CTE) of bond pads 130 and 230 is higher than that of dielectric materials such as 114/214, 116/216, 118/218, and 120/210. Therefore, a stress may be applied to pull dielectric barrier layers 120 and 220 apart from each other. After the elevated temperature of the bonding process, package components 100 and 200 are cooled. During the cooling stage of the bonding process, on the other hand, bond pads 130 and 230 shrink, which causes stresses to be generated. The stresses are applied on the bond pads and dielectric materials. These stresses may cause the delamination of bond pads and dielectric layers. In various embodiments of the present disclosure, the porous dielectric layers have the function of absorbing the stress, and hence the delamination of metal pads and dielectric layers is reduced.

In the bonded structure as shown in FIG. 11, stresses occur in the regions that are close to the interface between package components 100 and 200. The stresses have different values in different regions. Simulation results indicate that the highest stress is very likely to occur where the interface of dielectric barrier layers 120 and 220 joins the inter-diffused bond pads 130 and 230. The stress may cause the delamination of dielectric barrier layers 120 and 220, and/or the delamination of bond pads 130 and 230 if no porous materials are used. In various embodiments, the stresses are simulated on the structure shown in FIG. 11. The results obtained from the simulation indicated that in a first group of samples adopting the structure of the embodiments, no dielectric delamination and metal pad delamination were found. As a comparison, a second group of samples having similar structures as the embodiments were also formed, wherein the second group of samples uses USG to form both layers 116 and 118. The results indicated that the second group of samples has a dielectric delamination percentage of about 30 percent and about 80 percent, and a metal pad delamination percentage of about 10 percent and about 50 percent.

In accordance with some embodiments, an integrated circuit structure includes a package component, which further includes a non-porous dielectric layer having a first porosity, and a porous dielectric layer over and contacting the non-porous dielectric layer, wherein the porous dielectric layer has a second porosity higher than the first porosity. A bond pad penetrates through the non-porous dielectric layer and the porous dielectric layer. A dielectric barrier layer is overlying, and in contact with, the porous dielectric layer. The bond pad is exposed through the dielectric barrier layer. The dielectric barrier layer has a planar top surface. The bond pad has a planar top surface higher than a bottom surface of the dielectric barrier layer.

In accordance with other embodiments, an integrated circuit structure includes a first die and a second die. The first die includes a top IMD including a low-k dielectric material, a top metal feature in the top IMD, an etch stop layer overlying the top metal feature and the top IMD, a non-porous dielectric layer over and contacting the etch stop layer, and a porous dielectric layer over and contacting the porous dielectric layer. The first die further includes a first dielectric barrier layer over the porous dielectric layer, and a first bond pad extends from a top surface of the first dielectric barrier layer to the top metal feature. The second die includes a second bond pad bonded to the first bond pad, and a second dielectric barrier layer bonded to the first dielectric barrier layer.

In accordance with yet other embodiments, a method includes forming a first die, which includes forming a non-porous dielectric layer over a top metal feature, forming a porous dielectric layer over and contacting the porous dielectric layer, forming a first dielectric barrier layer over the porous dielectric layer, and etching the non-porous dielectric layer and the porous dielectric layer to form an opening, wherein the top metal feature is exposed through the opening. The formation of the first die further includes filling the opening with a metallic material to form a first bond pad in the opening. The first die is then bonded to a second die, wherein the first bond pad is bonded to a second bond pad in the second die, and wherein the first dielectric barrier layer is bonded to a second dielectric barrier layer in the second die.

Although various embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a first die comprising:
      forming a first dielectric layer over a top metal feature, the first dielectric layer having a first porosity;
      forming a second dielectric layer over and contacting the first dielectric layer, the second dielectric layer having a second porosity larger than the first porosity;
      etching the first dielectric layer and the second dielectric layer to form an opening, wherein the top metal feature is exposed through the opening;
      filling the opening with a conductive material to form a first bond pad in the opening;
      forming a first dielectric barrier layer over the second dielectric layer, wherein the forming the first dielectric barrier layer comprises:
         after the first bond pad is formed, forming a blanket dielectric barrier layer; and
         performing a photolithography to pattern the blanket dielectric barrier layer and to form the first dielectric barrier layer; and
      bonding the first die to a second die, wherein the first bond pad is bonded to a second bond pad in the second die, and wherein the first dielectric barrier layer is bonded to a second dielectric barrier layer in the second die, wherein the bonding the first die to the second die further comprises:
         pre-bonding the first dielectric barrier layer and the second dielectric barrier layer at a temperature of between about 140° C. and about 160° C. for a time of between about 1 minute and about 5 minutes; and
         annealing the first dielectric barrier layer and the second dielectric barrier layer at a temperature of between about 300° C. and about 400° C.

2. The method of claim 1, wherein the bonding the first die to the second die comprises curing the first die and the second die.

3. The method of claim 1, wherein when the bonding is performed, the first die is a part of an un-sawed first wafer, and the second die is a part of an un-sawed second wafer, and wherein the method further comprising, after the bonding, sawing the first die and the second die from the first wafer and the second wafer.

4. The method of claim 1, wherein the first dielectric layer and the second dielectric layer are etched in a same photolithography process.

5. The method of claim 1, wherein the first porosity is lower than about 5 percent.

6. The method of claim 1, wherein the pre-bonding the first dielectric barrier layer and the second dielectric barrier layer further comprises curing the first dielectric barrier layer and the second dielectric barrier layer at a temperature of between about 170° C. and about 190° C. for a time of between about 60 minutes and about 120 minutes.

7. A method of manufacturing a semiconductor device, the method comprising:
   depositing a first dielectric layer with a first porosity onto a substrate;
   depositing a second dielectric layer over the first dielectric layer, wherein the second dielectric layer has a second porosity larger than the first porosity;
   etching the first dielectric layer and the second dielectric layer to form a first opening with sidewalls, the first opening extending at least through the first dielectric layer and also through the second dielectric layer;

filling the first opening with a conductive material;

after the filling the first opening with the conductive material depositing a first dielectric barrier layer over the conductive material; and patterning the first dielectric barrier layer to expose at least a portion of the conductive material; and bonding a semiconductor die to the conductive material, wherein the bonding the semiconductor die comprises bonding a second conductive material within the semiconductor die to the conductive material, wherein the bonding the semiconductor die to the conductive material further comprises:

pre-bonding the first dielectric barrier layer and a second dielectric barrier layer on the semiconductor die at a temperature of between about 140° C. and about 160° C. for a time of between about 1 minute and about 5 minutes; and annealing the first dielectric barrier layer and the second dielectric barrier layer at a temperature of between about 300° C. and about 400° C.

8. The method of claim 7, wherein the filling the first opening further comprises:

depositing a conductive liner into a portion of the opening; and filling a remainder of the first opening with a bulk fill material.

9. The method of claim 7, wherein the first dielectric barrier layer is a siloxane based polymer.

10. The method of claim 9, wherein the depositing the first dielectric layer deposits the first dielectric layer with a thickness of less than about 1 µm.

11. The method of claim 7, wherein the filling the first opening further comprises:

depositing the conductive material into the first opening; and polishing the conductive material such that the conductive material is planar with the second dielectric layer.

12. The method of claim 7, wherein the depositing the first dielectric layer deposits a material with a porosity less than 5 percent.

13. The method of claim 12, wherein the depositing the second dielectric layer deposits a material with a porosity greater than 5 percent.

14. The method of claim 7, wherein the second conductive material within the semiconductor die is a bond pad.

15. The method of claim 7, wherein the patterning the first dielectric barrier layer to expose at least the portion of the conductive material is performed at least in part with a photolithographic masking and etching process.

16. The method of claim 7, wherein the pre-bonding the first dielectric barrier layer and the second dielectric barrier layer further comprises curing the first dielectric barrier layer and the second dielectric barrier layer at a temperature of between about 170° C. and about 190° C. for a time of between about 60 minutes and about 120 minutes.

17. A method of manufacturing a semiconductor device, the method comprising:

depositing a first dielectric material and a second dielectric material onto a substrate, wherein the second dielectric material has a larger porosity than the first dielectric material;

using a mask to pattern through the first dielectric material and the second dielectric material and form a first opening;

filling the first opening with a conductive material;

depositing a first dielectric barrier layer in physical contact with the second dielectric material after the filling the first opening with the conductive material; and patterning the first dielectric barrier layer to expose the conductive material; and bonding the conductive material to a second conductive material located in a semiconductor die and bonding the first dielectric barrier layer to a second dielectric barrier layer located in the semiconductor die, wherein the bonding the conductive material to the second conductive material and the bonding the first dielectric barrier layer to the second dielectric barrier layer further comprises:

pre-bonding the first dielectric barrier layer and the second dielectric barrier layer at room temperature for a time of less than about one minute; and annealing the first dielectric barrier layer and the second dielectric barrier layer at a temperature of between about 300° C. and about 400° C.

18. The method of claim 17, wherein the first dielectric barrier layer is no greater than about 1 µm.

19. The method of claim 17, wherein the second dielectric barrier layer has a porosity greater than 5 percent.

20. The method of claim 17, wherein the first dielectric barrier layer is a siloxane based polymer.

* * * * *